(12) United States Patent
Shirakawa et al.

(10) Patent No.: US 8,861,163 B2
(45) Date of Patent: Oct. 14, 2014

(54) PROTECTION RELAY

(75) Inventors: Hiroyuki Shirakawa, Fuchu (JP);
Yusuke Yanagihashi, Tokorozawa (JP);
Hiroyuki Maehara, Fuchu (JP); Toshio Tanaka, Ome (JP); Noriyoshi Suga, Hachioji (JP); Itsuo Shuto, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/476,419

(22) Filed: May 21, 2012

(65) Prior Publication Data
US 2012/0229946 A1 Sep. 13, 2012

Related U.S. Application Data

(63) Continuation of application No. PCT/JP2010/071262, filed on Nov. 29, 2010.

(30) Foreign Application Priority Data

Nov. 30, 2009 (JP) ................................. 2009-271457

(51) Int. Cl.
*H02H 3/20* (2006.01)
*H02H 3/02* (2006.01)
*H03K 17/795* (2006.01)

(52) U.S. Cl.
CPC . *H02H 3/02* (2013.01); *H02H 3/20* (2013.01); *H03K 17/7955* (2013.01)
USPC .......................... 361/93.1; 361/91.1; 361/91.2

(58) Field of Classification Search
USPC ....................................... 361/93.1, 91.1, 91.3
See application file for complete search history.

(56) References Cited

U.S. PATENT DOCUMENTS

| | | | | |
|---|---|---|---|---|
| 4,420,810 A | * | 12/1983 | Hernandez et al. | 700/281 |
| 5,587,865 A | * | 12/1996 | Bielig et al. | 361/45 |
| 6,590,757 B2 | * | 7/2003 | Pahl et al. | 361/93.2 |

(Continued)

FOREIGN PATENT DOCUMENTS

| | | |
|---|---|---|
| CN | 101102075 A | 1/2008 |
| CN | 101141058 A | 3/2008 |

(Continued)

OTHER PUBLICATIONS

International Search Report issued Feb. 22, 2011 in PCT/JP2010/071262 filed Nov. 29, 2010 (with English translation).

(Continued)

*Primary Examiner* — Rexford Barnie
*Assistant Examiner* — Angela Brooks
(74) *Attorney, Agent, or Firm* — Oblon, Spivak, McClelland, Maier & Neustadt, L.L.P.

(57) ABSTRACT

According to one embodiment, there is provided a protection relay. The protection relay includes an input circuit that detects a state of an external device according to whether or not an external input voltage is larger than a preset threshold voltage. The input circuit includes switching unit that is made conductive by a divided voltage obtained by voltage-dividing resistors that divide the external input voltage when the external input voltage is higher than or equal to the threshold voltage, and a photocoupler that is operated by a constant current of a constant current output circuit supplying a constant current and outputs an operation signal to the operation unit when the switching unit is made conductive.

4 Claims, 2 Drawing Sheets

(56) References Cited

U.S. PATENT DOCUMENTS

| | | | |
|---|---|---|---|
| 7,057,868 B2 * | 6/2006 | Moran et al. | 361/83 |
| 2003/0063420 A1 * | 4/2003 | Pahl et al. | 361/93.1 |
| 2004/0125518 A1 | 7/2004 | Moran et al. | |
| 2008/0123382 A1 | 5/2008 | Matsushita | |
| 2009/0021871 A1 * | 1/2009 | Moran et al. | 361/15 |
| 2009/0289557 A1 * | 11/2009 | Itoh et al. | 315/127 |
| 2012/0155123 A1 * | 6/2012 | Tang et al. | 363/21.15 |
| 2012/0243271 A1 * | 9/2012 | Berghegger | 363/21.15 |

FOREIGN PATENT DOCUMENTS

| | | |
|---|---|---|
| JP | 52-54935 | 5/1977 |
| JP | 3-82968 | 4/1991 |
| JP | 2005-101781 | 4/2005 |
| JP | 2008-17558 | 1/2008 |
| JP | 2008-152309 | 7/2008 |
| JP | 2008-160934 | 7/2008 |
| RU | 2 046 485 C1 | 10/1995 |
| SU | 928504 | 5/1982 |
| SU | 01665352 | 7/1991 |

OTHER PUBLICATIONS

Internation Written Opinion issued Feb. 22, 2011 in PCT/JP2010/071262 filed Nov. 29, 2010.

Russian Office Action issued Aug. 13, 2013, in Russia Patent Application No. 2012122189/07(033704) (with English translation).

Taiwanese Office Action issued May 24, 2013, in Taiwan Patent Application No. 099141252 (with English translation).

English translation of the International Preliminary Report on Patentability issued Jul. 19, 2012 in PCT/JP2010/071262 filed Nov. 29, 2010.

Written Opinion of the International Searching Authority issued Feb. 22, 2011 in PCT/JP2010/071262 filed Nov. 29, 2010 (submitting English translation only, previously filed May 21, 2012).

Office Action mailed on Oct. 24, 2013, in Chinese Patent Application No. 201080035414.8, filed on Nov. 29, 2010 (With English Translation).

Office Action mailed on Dec. 17, 2013, in Russian Patent Application No. 2012122189/07 (033704) (with English-language translation).

* cited by examiner

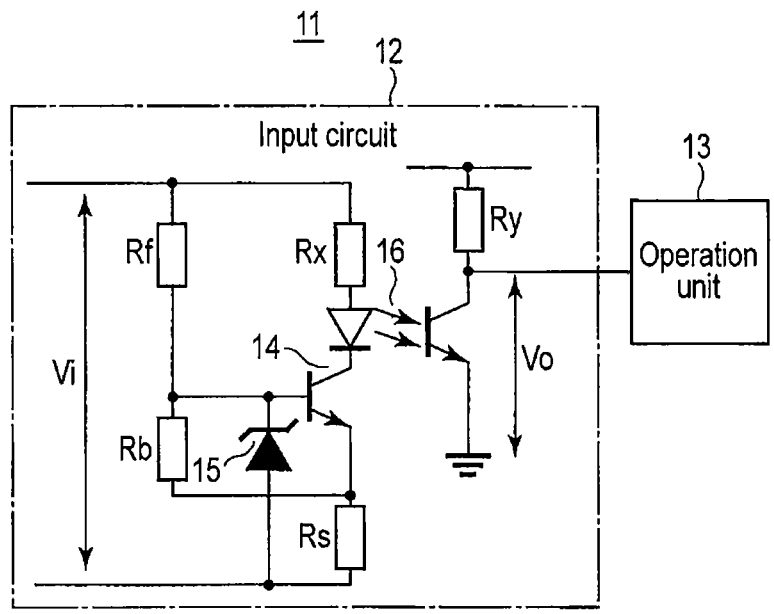
F I G. 1
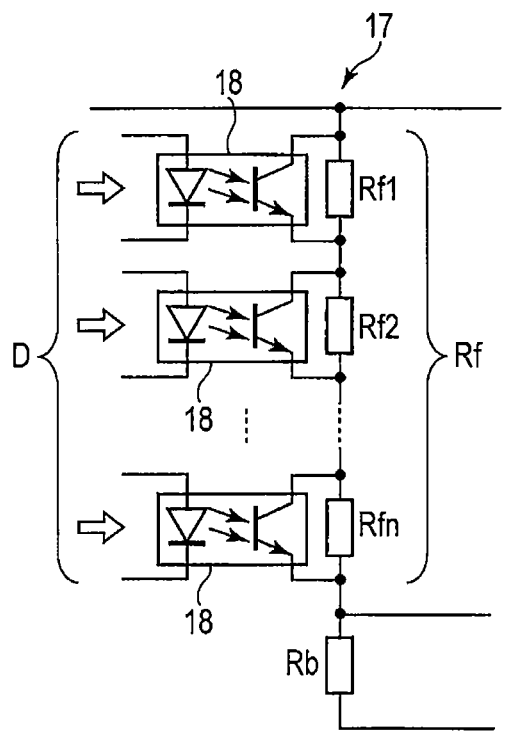
F I G. 2

US 8,861,163 B2

PROTECTION RELAY

CROSS REFERENCE TO RELATED APPLICATIONS

This application is a Continuation Application of PCT Application No. PCT/JP2010/071262, filed Nov. 29, 2010 and based upon and claiming the benefit of priority from prior Japanese Patent Application No. 2009-271457, filed Nov. 30, 2009, the entire contents of which are incorporated herein by reference.

FIELD

Embodiments described herein relate generally to a protection relay including an input circuit that detects the state of an external device according to whether or not an external input voltage is larger than a preset threshold voltage.

BACKGROUND

For example, a protection relay that protects a power system detects a system accident based on the magnitudes of an input current and input voltage, phase relationship and the like and performs a protection control operation to protect the power system. In this case, the state of the external device is input by use of a contact input signal and, for example, contact input (Binary input) is detected according to the magnitude of an external input voltage value with respect to a preset threshold voltage.

The conventional contact input circuit realizes detection or non-detection of contact input by adjusting a current value flowing through a photocoupler and setting a threshold voltage by means of resistors connected in series with or in parallel with the photocouplers as a current-limiting resistor system. In the respective contact input circuits, one threshold voltage is set for one circuit. Therefore, in order to cope with a plurality of threshold voltages, it is necessary to change the setting of a threshold voltage with respect to an external input voltage. Therefore, as a general means of coping with this, a circuit having resistance constants changed to change the setting of a threshold voltage is prepared and a circuit board thereof is mounted.

In the contact input circuit of the current-limiting resistor system, there is provided an input circuit of a programmable controller that can vary the duty ratio to reduce heat generation by ON/OFF controlling output of a photocoupler that transmits a detected contact input signal to an operation unit by means of a switching element (for example, see Jpn. Pat. Appln. KOKAI Publication No. 2008-152309 (that is hereinafter referred to as "Patent Document 1")). Further, a constant current circuit is realized by making an attempt to reduce heat generation of a contact input circuit by use of a bypass current circuit and setting two transistors in an ON state by use of a voltage value defined based on a resistance-divided voltage and Zener diode (for example, see Jpn. Pat. Appln. KOKAI Publication No. 2005-101781 (that is hereinafter referred to as "Patent Document 2")).

However, in the contact input circuit based on the conventional current-limiting resistor system, the power consumption in the resistors serially connected for adjustment of the threshold voltage becomes larger and becomes a cause of a temperature rise of the device. Further, since the forward current value that causes the photocoupler to emit light is adjusted by means of resistors and depends on the performance of the photocoupler, it becomes difficult to adjust the threshold voltage for wide-range input voltages by use of one contact input circuit. Therefore, if an attempt is made to set a plurality of threshold voltages in a wide range by use of one contact input circuit, the threshold voltage adjustment cannot be achieved simply by changing the resistance constant.

Further, in Patent Document 1, since a switching element is turned ON only when photocoupler output is read, heat generation due to the current-limiting resistor can be reduced, but it is difficult to adjust the threshold voltage for wide-range input voltages by use of one contact input circuit. Further, in Patent Document 2, since a bypass current circuit is provided, the circuit configuration becomes complicated although the threshold voltage can be adjusted for wide-range input voltages by use of one contact input circuit.

Under the circumstances, it is desired to provide a protection relay including an input circuit capable of adjusting a threshold voltage for wide-range input voltages by use of one contact input circuit and reducing a heat generation amount without making the circuit configuration complicated.

BRIEF DESCRIPTION OF THE DRAWINGS

FIG. 1 is a configuration diagram of a protection relay according to a first embodiment of the present invention;

FIG. 2 is an explanatory view of threshold voltage adjusting unit for changing a threshold voltage in an input circuit of the protection relay according to the first embodiment of the present invention.

DETAILED DESCRIPTION

Figure 3:
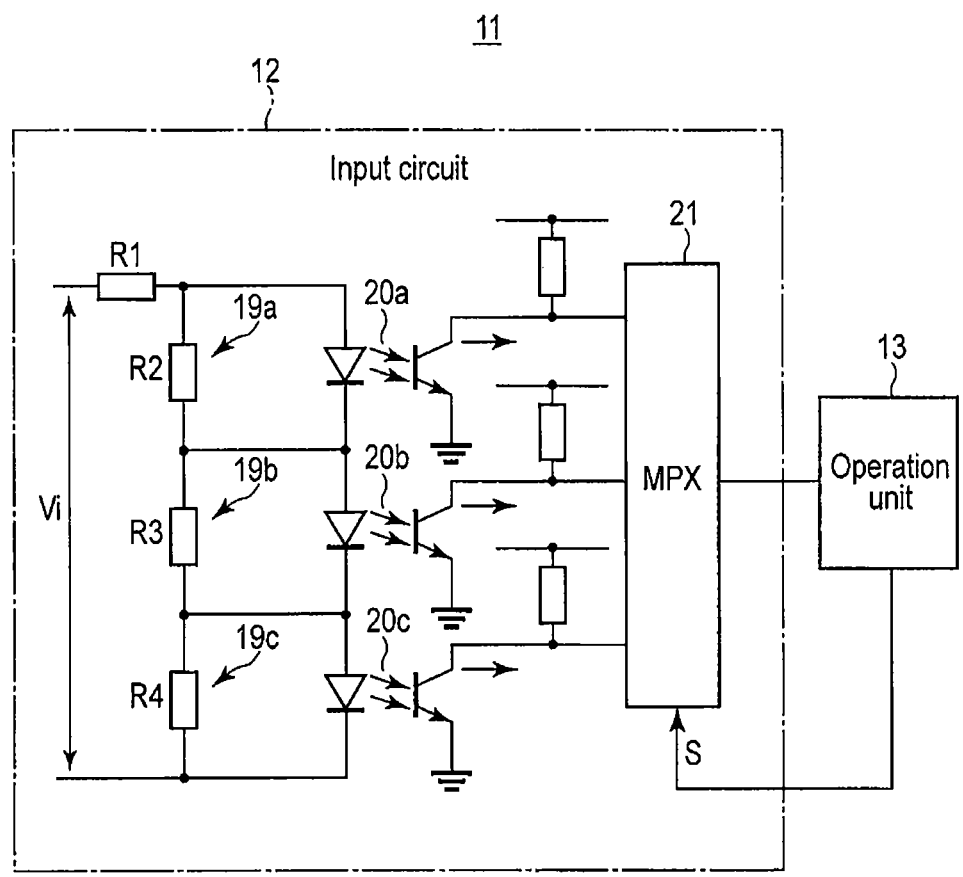
FIG. 3 is a configuration diagram of a protection relay according to a second embodiment of the present invention.

Embodiments will be described with reference to the drawings.

In general, according to one embodiment, there is provided a protection relay. The protection relay includes: an input circuit that detects a state of an external device according to whether or not an external input voltage is larger than a preset threshold voltage; and an operation unit that fetches a detection signal detected by the input circuit and performs a protection relay operation. The input circuit includes: switching unit that is made conductive by a divided voltage obtained by voltage-dividing resistors that divide the external input voltage when the external input voltage is higher than or equal to the threshold voltage, and a photocoupler that is operated by a constant current of a constant current output circuit supplying a constant current and outputs an operation signal to the operation unit when the switching unit is made conductive.

FIG. 1 is a configuration diagram of a protection relay according to a first embodiment of the present invention. A protection relay 11 is configured by an input circuit 12 that detects a state of an external device and an operation unit 13 that fetches a detection signal detected by the input circuit 12 and performs a protection relay operation.

The input circuit 12 is configured to detect the state of the external device according to whether or not external input voltage Vi is larger than a preset threshold voltage. External input voltage Vi representing the state of the external device is input between a positive polarity line and negative polarity line of the input circuit 12 and is divided by resistors Rf, Rb, Rs. Then, the divided voltage at a connection node of voltage-dividing resistors Rf, Rb is input to the base of a transistor that is switching unit 14. A Zener diode 15 is connected between the base of the switching unit 14 and the negative polarity line, resistor Rs is connected between the emitter of the switching unit 14 and the negative polarity line, and a light emitting diode of a photocoupler 16 is connected between the collector of the switching unit 14 and the positive polarity line via resistor Rx.

On the other hand, a phototransistor operated according to light of the light emitting diode of the photocoupler 16 is connected between the positive polarity line and the negative polarity line via resistor Ry, and is configured to output output voltage Vo to the operation unit 13 when the phototransistor of the photocoupler 16 is operated.

That is, the input circuit 12 adjusts a base current of the switching unit 14 based on the divided voltage value of resistor Rf and resistor Rb with respect to external input voltage Vi and a Zener voltage of the Zener diode 15 and switching-controls the switching unit 14. Therefore, a detected threshold voltage can be set based on the divided voltage value at the connection node of resistor Rf and resistor Rb.

When the switching unit 14 that performs switching control is set in an ON state, a constant current flows through the photocoupler 16 and the light emitting diode of the photocoupler 16 emits light. As a result, a detection signal is transmitted to the operation unit 13 from the input circuit 12. The constant current value is adjusted by means of resistor Rs based on the voltage between the base and emitter of the switching unit 14 and Zener voltage of the Zener diode 15, and is set to a current value at which the photocoupler 16 is stably operated.

Therefore, when external input voltage Vi is higher than or equal to the threshold voltage, the switching unit 14 is made conductive according to the divided voltage at the connection node of voltage-dividing resistors Rf, Rb that divide external input voltage Vi. A constant current output circuit supplying a constant current is configured by the base-emitter of the switching unit 14, Zener diode 15, and resistor Rs, and the photocoupler 16 is operated according to a constant current of the constant current output circuit and outputs an operation signal to the operation unit 13 when the switching unit 14 becomes conductive.

Thus, in comparison with the input circuit based on the conventional current limiting resistance system, the threshold voltage can be set by resistance-type voltage division without depending on the forward current of the photocoupler 16, the power consumption is prevented from being concentrated on one resistor and a heat generation amount can be reduced. Further, since the constant current operation is performed, it can be used with a stable operation current of the photocoupler 16 that is approximately 1.5 mA, for example. In order to change the threshold voltage, it is performed by changing the constant of resistor Rf. For example, the threshold voltage is changed by providing a resistor of a necessary constant and making a switching by means of a short-circuiting connector or the like.

Further, as shown in FIG. 2, threshold voltage adjusting unit 17 that changes the threshold voltage in the input circuit may be provided to change the threshold voltage. In FIG. 2, resistor Rf is configured by a plurality of resistors Rf1 to Rfn and a bypass switching element 18 is provided in parallel with each of resistors Rf1 to Rfn. ON/OFF of the bypass switching element 18 is controlled to change a value of the whole portion of resistor Rf according to change instruction D of the threshold voltage from the operation unit 13. As a result, the voltage-division ratio of voltage-diving resistors Rf, Rb is adjusted to adjust the threshold voltage for external input voltage Vi and the threshold voltage is changed while a divided voltage at the connection node of voltage-dividing resistors Rf, Rb is maintained at a voltage that makes the switching unit 14 conductive.

That is, as an adjustment circuit for the resistance of resistor Rf, the bypass switching elements 18 are respectively connected to a plurality of series-connected resistors Rf1 to Rfn. In FIG. 2, a case where the bypass switching element 18 uses a photocoupler is shown.

The resistance of the whole portion of resistor Rf is adjusted by ON/OFF-control of the bypass switching element 18 to change the threshold voltage of the input circuit 12. That is, the combined resistance of the series resistors can be adjusted by transmitting change instruction D of the threshold voltage from the operation unit 13 of the protection relay to the photocoupler that is the bypass switching element 18 and the threshold voltage can be switched according to software of the operation unit 13 without causing the user to directly touch the substrate.

The reason why the photocoupler is used as the bypass switching element 18 is to make an attempt of isolation for the operation unit 13 that is a light electrical circuit of 3.3 V or 5 V with respect to input to the input circuit 12 of the external input voltage of 24 V, 48 V, 110 V, 220 V or the like.

In this case, the switching operation due to isolation is an object and the bypass switching element 18 is not limited to the photocoupler. As shown in FIG. 1, since the input circuit 12 is a constant current input circuit and sets the threshold voltage by use of voltage-dividing resistors, for example, threshold voltages can be set with respect to wide-range input voltages of 24 V, 48 V, 110 V, 220 V.

As a result, at the time of changing the threshold voltage, the operation of mounting or removing a short-circuiting connector or the like to a substrate becomes unnecessary and the threshold voltage can be easily changed by setting the same according to software of the operation unit 13 incorporated in the protection relay.

According to the first embodiment, an internal temperature rise of the protection relay 11 can be reduced by suppressing the power consumption in series-connected resistors Rf, Rb, Rs and a plurality of threshold voltages in a wide range can be set by use of one input circuit 12. Further, when threshold voltage adjusting unit is provided, a plurality of threshold voltages can easily be set by use of one input circuit 12.

Next, a second embodiment of the present invention is explained. FIG. 3 is a configuration diagram of a protection relay according to the second embodiment of the present invention. The second embodiment includes an input circuit 12 that makes it possible to switch a plurality of threshold voltages by use of a current-limiting resistor circuit.

As shown in FIG. 3, the input circuit 12 inputs external input voltage Vi to series-connected resistors R1 to R4 of the current-limiting resistor circuit. Resistors R2 to R4 of the current-limiting resistor circuit configure input detection units 19a to 19c that respectively detect a plurality of different threshold voltages. Further, photocouplers 20a to 20c are respectively connected in parallel with resistors R2 to R4 of the input detection units 19a to 19c. Each of the photocouplers 20a to 20c is operated when external input voltage Vi becomes higher than or equal to a corresponding threshold voltage to be detected and output an operation signal to the operation unit 13 via a multiplexer 21.

That is, the current-limiting resistor circuit adjusts forward currents of the respective photocouplers 20a to 20c by means of series-connected resistor R1 and resistors R2 to R4 connected in parallel with the respective photocouplers 20a to 20c to adjust the threshold voltage to be detected.

A plurality of to-be-detected threshold voltages can be simultaneously detected by use of one input circuit 12 (one input voltage Vi) by detecting the input signal by means of a plurality of photocouplers 20a to 20c. In the three photocouplers 20a to 20c of FIG. 3, for example, if the forward currents of the respective photocouplers 20a to 20c are previously adjusted to cause the photocoupler 20a to provide a determination result based on a threshold value of 48 V, cause the photocoupler 20b to provide a determination result based on a threshold value of 110 V and cause the photocoupler 20c to provide a determination result based on a threshold value of 220 V, an input signal with an intended threshold voltage can be detected.

For example, when external input voltage Vi is 45 V that is lower than or equal to the minimum threshold value 48 V, none of the photocouplers 20a to 20c become operative and when external input voltage Vi is 50 V, which is in a range of the minimum threshold value 48 V to the intermediate threshold value 110 V, the photocoupler 20a is operated and neither of the photocouplers 20b, 20c is operative. Further, when external input voltage Vi is 120 V, which is in a range of the intermediate threshold value 110 V to the maximum threshold value 220 V, the photocouplers 20a, 20b are operated and the photocoupler 20c is inoperative and when external input voltage Vi is 230 V, which is higher than or equal to the maximum threshold value, all of the photocouplers 20a to 20c are operated. As a result, an input signal with an intended threshold voltage can be detected.

Thus, the respective input detection units 19a to 19c divide and input external input voltage Vi to detect a plurality of different threshold voltages, and each of the photocouplers 20a to 20c respectively connected in parallel with the input detection units 19a to 19c outputs an operation signal to the operation unit 13 via the multiplexer 21 when external input voltage Vi becomes higher than or equal to a corresponding threshold voltage to be detected.

The multiplexer 21 receives operation signals of the photocouplers 20a to 20c and outputs an operation signal of the photocouplers 20a to 20c specified by selection signal S from the operation unit 13 to the operation unit 13. That is, the multiplexer 21 can acquire a threshold value determination result of a necessary condition from a plurality of to-be-detected threshold voltages set on one input circuit 12 (one external input voltage Vi) by selecting an output signal of each of the photocouplers 20a to 20c according to selection signal S from the operation unit 13.

Further, switching to an output value of only the intended to be-detected threshold voltage is made by transmitting selection signal S to the multiplexer 21 by means of the operation unit 13 of the protection relay 11, but the multiplexer 21 may be omitted and all of the output signals of the respective photocouplers 20a to 20c may be output to the operation unit 13. In this case, the operation unit 13 selects an output value of only the intended to-be-detected threshold voltage from the received output signals of the respective photocouplers 20a to 20c.

Further, the operation unit 13 can also monitor the inferiority of the input circuit 12 by determining a combination of the operation and non-operation of the photocouplers 20a to 20c based on the received output signals (operative signal and inoperative signal) of the respective photocouplers 20a to 20c. The combination of the operation and non-operation of the photocouplers 20a to 20c is shown in Table 1.

TABLE 1

|  | Input voltage Vi | Threshold voltage condition | State 1 | State 2 |
| --- | --- | --- | --- | --- |
| Photocoupler 20a | 110 V | 34 V or more | ON | OFF |
| Photocoupler 20b |  | 77 V or more | ON | ON |
| Photocoupler 20c |  | 154 V or more | OFF | OFF |
|  | Determination |  | Normal | Abnormal |

As shown in Table 1, as the condition of the threshold voltage, it is supposed that the photocoupler 20a is ON with 34 V or more, the photocoupler 20b is ON with 77 V or more and the photocoupler 20c is ON with 154 V or more. In Table 1, a case where input voltage Vi is 110 V for the above three threshold voltage conditions is shown.

If the input circuit 12 of FIG. 3 is normal, the ON/OFF state of output signals of the photocouplers 20a to 20c is set to determination of State 1 of Table 1 when input voltage Vi is 110 V. On the other hand, for example, if the result of State 2 of Table 1 is obtained, it can be determined that outputs of the photocoupler 20a and the input detection unit 19a of the threshold value of 34 V are abnormal.

Thus, it becomes possible to monitor the input circuit 12 by inputting not only a determination result of a specified threshold voltage but also all of determination results based on a plurality of threshold voltages and determining a combination thereof. That is, the presence or absence of light emission of the respective photocouplers 20a to 20c can be determined according to external input voltage Vi and the light emission states of the photocouplers 20a to 20c and the soundness of a peripheral circuit thereof can always mutually be monitored by software of the operation unit 13.

According to the second embodiment, it becomes possible to set a plurality of threshold voltages by means of the input circuit 12 of one input voltage value by using the conventional current-limiting resistance system. Further, the mutual input detection units 19a to 19c and photocouplers 20a to 20c or the like can be monitored by utilizing the detection results of the respective input detection units.

As described above in detail, according to the embodiments of the present invention, it is possible to provide a protection relay including an input circuit capable of adjusting a threshold voltage for wide-range input voltages by use of one contact input circuit and reducing a heat generation amount without making the circuit configuration complicated.

The present invention is not limited to the above embodiments as they are and can be embodied by modifying constituents in a range without departing from the scope thereof in the embodying stage. Further, various inventions can be formed by adequately combining a plurality of constituents disclosed in the above embodiments. For example, some constituents may be omitted from all of the constituents indicated in the embodiments. Additionally, the constituents in different embodiments can be adequately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A protection relay comprising:
  an input circuit that detects a state of an external device according to whether or not an external input voltage is larger than a preset threshold voltage; and
  an operation unit that fetches a detection signal detected by the input circuit and performs a protection relay operation, wherein
  the input circuit includes:
  a switching unit that is made conductive by a divided voltage obtained by voltage-dividing resistors that divide the external input voltage when the external input voltage is higher than or equal to the threshold voltage, and a photocoupler that is operated by a constant current of a constant current output circuit and outputs an operation signal to the operation unit when the switching unit is made conductive, wherein the protection relay further comprises a threshold voltage adjusting unit that adjusts a voltage division ratio of the voltage-dividing resistors to adjust the threshold voltage for the external input voltage while maintaining the divided voltage obtained by the voltage-dividing resistors at a voltage that makes the switching unit conductive, by changing a value of a register included in the voltage-dividing resistors.

2. A protection relay comprising:

an input circuit that detects a state of an external device according to whether or not an external input voltage is larger than a preset threshold voltage; and an operation unit that fetches a detection signal detected by the input circuit and performs a protection relay operation, wherein the input circuit includes:

a plurality of input detection units that divide and receive the external input voltage and detect a plurality of different threshold voltages, and photocouplers that are respectively connected in parallel with the detection units, each of the photocouplers being configured to output an operation signal to the operation unit when the external input voltage becomes higher than or equal to a corresponding threshold voltage to be detected, wherein the protection relay further comprises a threshold voltage adjusting unit that adjusts a voltage division ratio of voltage-dividing resistors that divide the external input voltage to adjust the threshold voltage for the external input voltage, by changing a value of a register included in the voltage-dividing resistors that divide the external input voltage.

3. The protection relay according to claim 2, wherein the input circuit includes a multiplexer that receives operation signals of the photocouplers and outputs an operation signal of the photocoupler specified by a selection signal from the operation unit.

4. The protection relay according to claim 2, wherein the operation unit receives an operative signal and inoperative signal of the photocouplers and monitors inferiority of the input circuit based on a combination of an operation and non-operation of the photocouplers.

* * * * *